(12) United States Patent
Kobayashi et al.

(10) Patent No.: US 8,357,956 B2
(45) Date of Patent: *Jan. 22, 2013

(54) SOLID-STATE IMAGING APPARATUS

(75) Inventors: Masahiro Kobayashi, Tokyo (JP); Yuichiro Yamashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/045,761

(22) Filed: Mar. 11, 2011

(65) Prior Publication Data
US 2011/0168872 A1    Jul. 14, 2011

Related U.S. Application Data

(62) Division of application No. 12/417,149, filed on Apr. 2, 2009, now Pat. No. 7,928,477.

(30) Foreign Application Priority Data

Apr. 9, 2008 (JP) ................................. 2008-101560

(51) Int. Cl.
*H01L 27/148* (2006.01)
(52) U.S. Cl. ........ 257/225; 257/231; 257/292; 257/443; 257/E27.151
(58) Field of Classification Search .................. 257/231, 257/292, 443, E27.151, 225
See application file for complete search history.

(56) References Cited

U.S. PATENT DOCUMENTS

| | | | |
|---|---|---|---|
| 7,462,810 B2 | 12/2008 | Kobayashi et al. | 250/208.1 |
| 7,928,477 B2 * | 4/2011 | Kobayashi et al. | 257/225 |
| 2007/0046795 A1 | 3/2007 | Yamashita | 348/294 |
| 2008/0029787 A1 | 2/2008 | Watanabe et al. | 257/233 |
| 2008/0036890 A1 | 2/2008 | Yamashita et al. | 348/308 |
| 2009/0009372 A1 | 1/2009 | Yamashita | 341/122 |
| 2009/0244328 A1 | 10/2009 | Yamashita | 348/241 |
| 2009/0284632 A1 | 11/2009 | Onuki et al. | 348/302 |
| 2009/0303364 A1 | 12/2009 | Shibata et al. | 348/302 |
| 2010/0053398 A1 | 3/2010 | Yamashita | 348/302 |

FOREIGN PATENT DOCUMENTS

JP    2005-166731 A    6/2005

\* cited by examiner

*Primary Examiner* — Long Pham

(74) *Attorney, Agent, or Firm* — Fitzpatrick, Cella, Harper & Scinto

(57) ABSTRACT

A solid-state imaging apparatus, controlling a potential on a semiconductor substrate for an electronic shutter operation, includes: a first semiconductor region of the first conductivity type for forming a photoelectric conversion region; a second semiconductor region of the first conductivity type, formed separately from the photoelectric conversion region, for accumulating carriers; a third semiconductor region of a second conductivity type arranged under the second semiconductor region, for operating as a potential barrier; a fourth semiconductor region of the second conductivity type extending between the first semiconductor region and the semiconductor substrate, and between the third semiconductor region and the semiconductor substrate; and a first voltage supply portion for supplying a voltage to the third semiconductor region; wherein the first voltage supply portion includes a fifth semiconductor region of the second conductivity type arranged in the pixel region, and a first electrode connected to the fifth semiconductor region.

7 Claims, 8 Drawing Sheets

SOLID-STATE IMAGING APPARATUS

CROSS REFERENCE TO RELATED APPLICATION

This application is a division of U.S. application Ser. No. 12/417,149 filed on Apr. 2, 2009, the entire disclosure of which is hereby incorporated by reference herein.

BACKGROUND OF THE INVENTION

1. Field of the Invention

The present invention relates to a solid-state imaging apparatus with an electronic shutter function and, in particular, to a solid-state imaging apparatus which discharges a carrier toward a substrate.

2. Description of the Related Art

Hitherto, a solid-state imaging apparatus has used a so-called a vertical overflow drain (VOFD) in which a voltage is applied to a semiconductor substrate to discharge a carrier of a photoelectric conversion element to control accumulation time, thereby realizing an electronic shutter function. Particularly, the function is often used in a CCD solid-state imaging apparatus.

Japanese Patent Application Laid-Open No. 2005-166731 proposes a solid-state imaging apparatus which causes a MOS solid-state imaging apparatus to operate a VOFD function to realize an electronic shutter function.

A structure shown in Japanese Patent Application Laid-Open No. 2005-166731 leaves room for improvement in the following respects.

Applying a high voltage to an N-type semiconductor substrate to realize the VOFD function significantly varies a potential in a buried layer due to a capacitive coupling between the substrate and a P-type buried layer acting as a potential barrier. This may significantly vary a potential in a P-type semiconductor region electrically connected to the buried layer. Particularly, if a pixel has a carrier accumulating region for temporarily holding a signal carrier from a photoelectric conversion region, a P-type semiconductor region forming a potential barrier is provided in the vicinity of the carrier accumulating region to effectively accumulate the carriers to significantly vary a potential in the P-type semiconductor region. As a result, the carriers accumulated in a carrier accumulation region leak toward the substrate to vary the amount of accumulated carriers, which may degrade image quality.

Variation in potential in the P-type semiconductor region forming the potential barrier can result also from variation in potential of a source and a drain in the operation of each MOS transistor. This is because a potential of a P-type well being a back gate of the MOS transistor capacitively coupled with the source or the drain varies to vary a potential in the P-type semiconductor region forming the potential barrier electrically connected to the well.

The present invention has been made in view of the above problem and an object of the present invention is to moderate variation in the amount of accumulated carriers when the VOFD function is used to realize an electronic shutter function, thereby performing a high image-quality photographing.

SUMMARY OF THE INVENTION

According to the present invention, a solid-state imaging apparatus having a semiconductor substrate of a first conductivity type, and a plurality of pixels arranged in a pixel region of the semiconductor substrate, each pixel including a photoelectric conversion region and an amplifying transistor for amplifying a signal based on a signal carrier generated in the photoelectric conversion region and for outputting an amplified signal, performing a vertical over flow drain operation, wherein the pixel region includes: a first semiconductor region of the first conductivity type for forming a part of the photoelectric conversion region; a second semiconductor region of the first conductivity type for accumulating the carriers generated in the photoelectric conversion region; a third semiconductor region of a second conductivity type arranged under the second semiconductor region, as a potential barrier holding the accumulated carriers in the second semiconductor region; a fourth semiconductor region of the second conductivity type extending between the first semiconductor region and the semiconductor substrate, and between the third semiconductor region and the semiconductor substrate; and a first voltage supply portion for supplying a reference voltage to the third semiconductor region, wherein the first voltage supply portion includes a fifth semiconductor region of the second conductivity type arranged in the pixel region, and a first electrode connected to the fifth semiconductor region.

Further features of the present invention will become apparent from the following description of exemplary embodiments with reference to the attached drawings.

The accompanying drawings, which are incorporated in and constitute a part of the specification, illustrate embodiments of the invention and, together with the description, serve to explain the principles of the invention.

DESCRIPTION OF THE EMBODIMENTS

The present embodiment of the present invention is described below with reference to the drawings.

Each embodiment is described with an electron used as a signal carrier. If a hole is used as a signal carrier, the conductivity type of each semiconductor region may be basically reversed and a supply voltage may be appropriately changed. An N type is taken as a first conductivity type and P type is taken as a second conductivity type reverse to the first conductivity type. In the embodiments, all potential barriers are against electrons being signal carriers. In the description, with regard to a positional relationship of each semiconductor region, a substrate depth direction from a light incident surface is taken as a downward direction.

First Embodiment

The first embodiment is described with reference to FIGS. 1 to 5.

Figure 1:
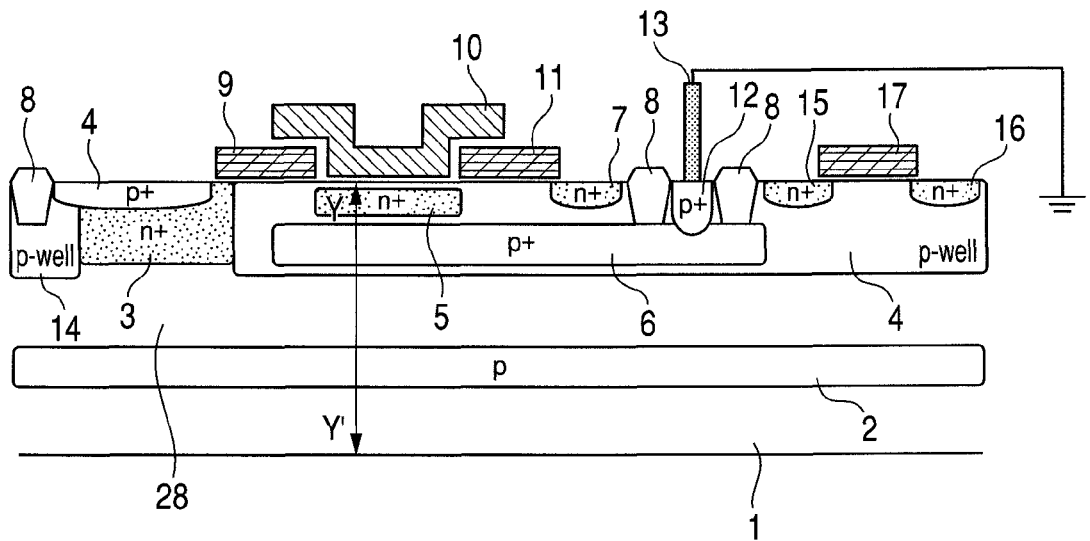
FIG. 1 is a schematic diagram for describing a first embodiment and a cross section taken along the line C-C' of FIG. 2.

FIG. 1 is a schematic cross section of a solid-state imaging apparatus according to the present embodiment. The solid-state imaging apparatus includes an N-type semiconductor substrate 1 and a P-type semiconductor region (a fourth semiconductor region) 2 and the P-type semiconductor region 2 is called buried layer because it is buried deeply in a position below the surface of the substrate. The buried layer 2 extends between the semiconductor substrate 1 and an element arrangement surface region where a photoelectric conversion region and a carrier accumulation region are arranged and serves as a potential barrier against a signal carrier.

An N-type semiconductor region (a first semiconductor region) 3 and a P-type semiconductor region 4 form parts of the photoelectric conversion region respectively. The N-type semiconductor region 3 is a region (the same in polarity as the signal carrier) which is capable of accumulating a signal carrier generated by photoelectric conversion and the P-type semiconductor region 4 functions as a surface inactivation layer for reducing dark current on the surface of the photoelectric conversion region. An N-type semiconductor region (a second semiconductor region and carrier accumulating region) 5 is provided separately from the photoelectric conversion region and forms a part of the carrier accumulation region which accumulates at least a part of the signal carriers generated in the photoelectric conversion region. A P-type semiconductor region (a third semiconductor region) 6 functions as a potential barrier from the carrier accumulating region 5 to the N-type semiconductor substrate 1. The potential barrier 6 is higher in impurity concentration than the buried layer 2. This is because carriers can be effectively accumulated in the carrier accumulating region 5 and the control amplitude width of a substrate potential is not extended at the time of performing the VOFD.

The buried layer 2 extends between the N-type semiconductor region 3 and the semiconductor substrate 1 and between the potential barrier 6 and the semiconductor substrate. The figure illustrates a schematic cross section of one pixel, actually however, the buried layer 2 extends across a plurality of pixels, preferably across all the pixels.

Figure 2:
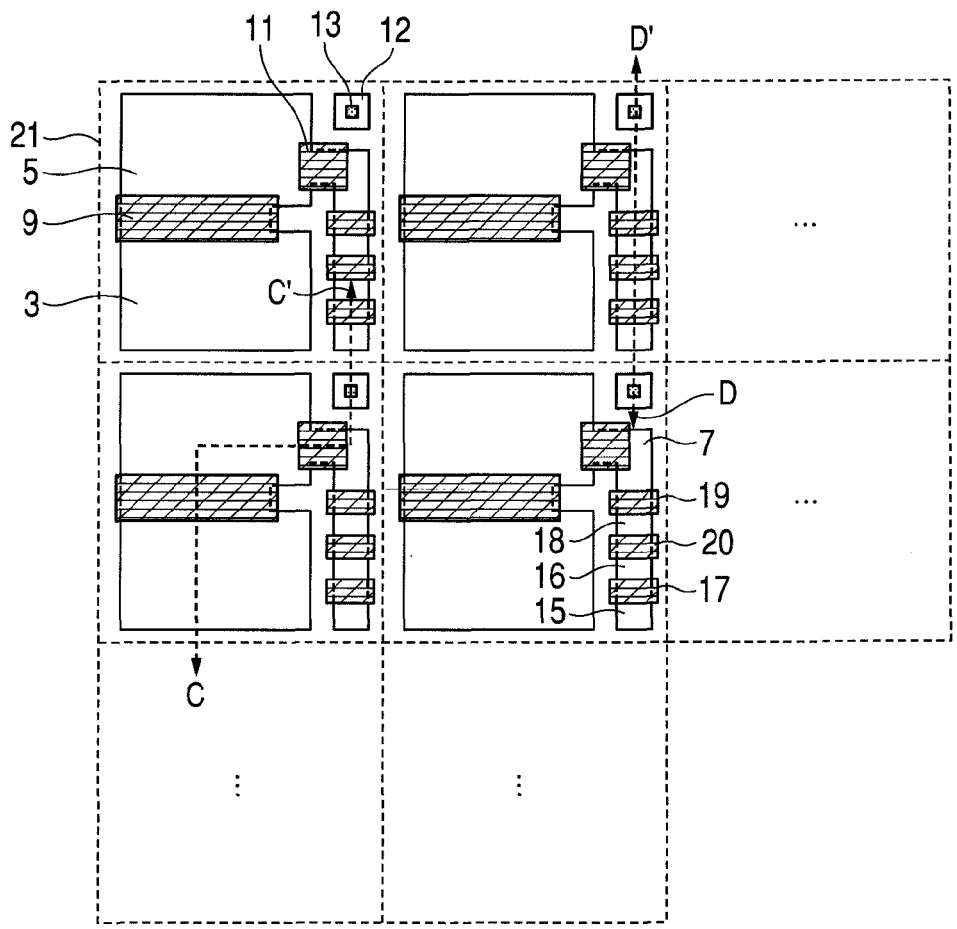
FIG. 2 is a plan view for describing the first embodiment.

An N-type semiconductor region 7 is a floating diffusion (FD) region. The carriers accumulated in the carrier accumulating region 5 are transferred. An element isolation region (a field region) 8 defines an active region. The element isolation region 8 may use LOCOS, STI or mesa structure. Semiconductor regions forming the elements (a photoelectric conversion region, a carrier accumulation region and a MOS transistor) are arranged in the active region defined by the element isolation region. In FIG. 2, the regions where the semiconductor regions and gate electrodes are not arranged are the element isolation regions.

A first transfer gate 9 transfers carriers from the N-type semiconductor region 3 to the carrier accumulating region 5. A carrier accumulation region control gate 10 controls the potential on the carrier accumulating region 5. A second transfer gate 11 transfers carriers from the carrier accumulating region 5 to the FD region. The gates can be formed of a conductor such as poly-silicon.

A P-type semiconductor region (a fifth semiconductor region) 12 is a region for supplying a reference voltage mainly to the potential barrier 6. A first electrode 13 is directly connected to the P-type semiconductor region 12 to supply the reference voltage thereto. Herein the grounding potential (GND) is supplied. The P-type semiconductor region 12 and the electrode 13 form a voltage supply portion. The voltage supply portion is provided in the pixel region. This is because it is difficult to supply the potential barriers 6 of all pixels with the reference voltage in a configuration where the voltage supply portion is provided outside the pixel region when the carrier accumulation region is provided separately from the photoelectric conversion region and an electronic shutter operation is performed by the VOFD. When the VOFD operation is performed, a potential vertical to the substrate needs setting so that electrons are discharged from the photoelectric conversion region to the substrate side, so that the potential barrier existing between the N-type semiconductor substrate and photoelectric conversion region cannot be heightened so much. In other words, the concentration of the P-type semiconductor region needs to be relatively lowered under the photoelectric conversion region. That is to say, when the reference voltage is supplied from the outside of the pixel region, a resistance in the region is increased, so that merely supplying a voltage from the outside of the pixel region is sometimes insufficient to supply the reference voltage to the entire pixel region. For this reason, the voltage supply portion can be arranged in the pixel region or, more desirably, a plurality of the voltage supply portions can be arranged in the pixel region.

A P-type semiconductor region (a third semiconductor region) 14 is a well in which the source and the drain region of an undermentioned amplifying MOS transistor are arranged. The N-type semiconductor region 5 and the FD region 7 may be arranged therein. The P-type semiconductor region 14 functions as the back gate of the MOS transistor. Furthermore, the potential barrier 6 may be arranged in the well 14. The well 14 is electrically connected to the potential barrier 6. In other words, the N-type semiconductor region is not arranged between the well 14 and the potential barrier 6. Even if the N-type semiconductor region is arranged therebetween, the N-type semiconductor region is depleted.

N-type semiconductor regions 15 and 16 are the source and the drain region of the amplifying MOS transistor respectively. The N-type semiconductor region 15 is a source region functioning as an output node. The N-type semiconductor region 16 is a drain region. A gate 17 of the amplifying MOS transistor is electrically connected to the FD region 7 through a conductor (not shown).

Out of an N-type semiconductor region 28, a region mainly corresponding to the lower portion of the N-type semiconductor region 3 can function as a part of the photoelectric conversion region. The N-type semiconductor region 28 is set lower in impurity concentration than the N-type semiconductor region 3 and the buried layer 2, although the conductivity type of the N-type semiconductor region 28 is reverse to the buried layer 2. The reason the N-type semiconductor region 28 is set lower in impurity concentration is that the VOFD can be effectively operated. Although the conductivity type of the semiconductor region 28 may be changed to P type with a region low in impurity concentration, the volume of the photoelectric conversion region can be increased particularly the region under the photoelectric conversion region, so that the semiconductor region 28 desirably be of N type. Furthermore, the semiconductor region 28 is desirably set low in impurity concentration to perform the VOFD operation. Low impurity concentration makes it easy to capacitively couple the buried layer 2 to the potential barrier 6. In this case, the potential barrier 6 is susceptible to variation in potential on the buried layer 2 at the time of the VOFD operation. For the operation of a global electronic shutter, carriers are being accumulated in the carrier accumulating region 5 during the VOFD operation, so that the configuration of the present embodiment is particularly effective when the global electronic shutter is operated by the VOFD.

FIG. 2 is a top view of a solid-state imaging apparatus. The figure illustrates only the members relevant to the present embodiment. The members having the same functions as the members in FIG. 1 are given the same reference numerals to omit the detailed description thereof. FIG. 1 is a cross section taken along the line C-C' of FIG. 2. A gate electrode 19 of the MOS transistor forms a reset portion described later. A gate electrode 20 of the MOS transistor forms a selecting portion described later. A drain region 18 of a reset MOS transistor is also provided.

Regions defined by a broken line 21 are pixels. A plurality of such pixels is arranged to form a pixel region.

As illustrated in FIG. 2, the P-type semiconductor region 12 and the electrode 13 can be arranged in the active region near the active region where a carrier holding portion is arranged through the element isolation region. This is because an impedance (resistance) between the potential barrier 6 and the P-type semiconductor region 12 can be decreased to enable moderating the width of variation in potential on the potential barrier 6. Thereby, the amount of leakage of carriers from the carrier accumulation region can be further decreased.

Figure 3:
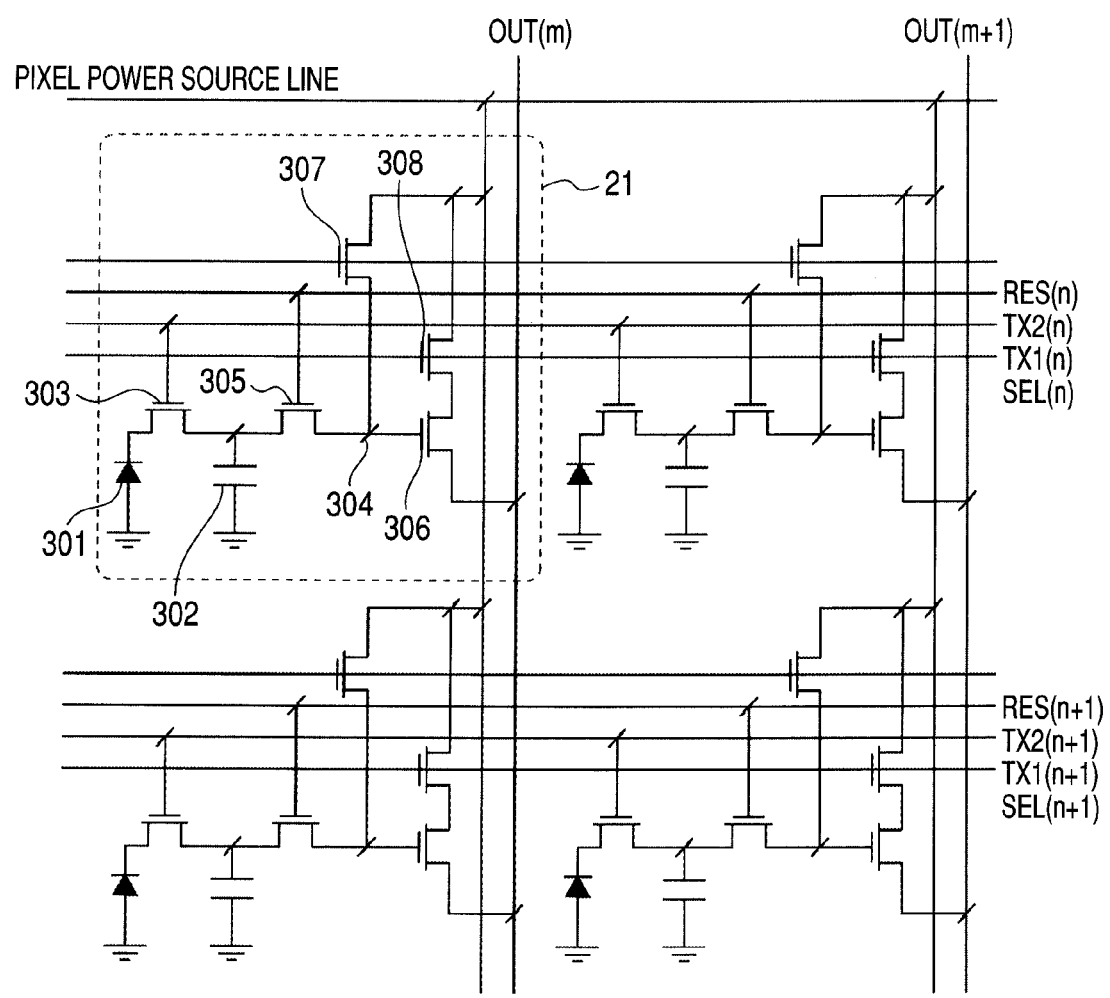
FIG. 3 is an equivalent circuit for describing the first embodiment.

FIG. 3 is an equivalent circuit of the solid-state imaging apparatus according to the present embodiment.

A photoelectric conversion region 301 is formed of a photo diode, for example. A carrier accumulation region 302 accumulates carriers generated in the photoelectric conversion region. A first transfer portion 303 transfers carriers generated in the photoelectric conversion element to the carrier accumulation region. An FD region 304 is connected to the input portion of an after-mentioned amplifier and is in a floating state at the time of reading signals to a vertical signal line. A second transfer portion 305 transfers carriers from the carrier accumulation region to the FD region. Each transfer portion may be formed of a MOS transistor, for example. The first transfer portion may be the same as or different from the second transfer portion in transfer characteristic. For example, a buried-channel MOS transistor is used as the first transfer portion to transfer at least a part of carriers in the photoelectric conversion region to the carrier accumulation region in an OFF state. In this case, carriers can be transferred to the carrier accumulation region in the midst of incidence of light to enable the realization of a so-called global electronic shutter in which the accumulation time of all pixels can be equalized. In such a configuration, carriers are accumulated for a long time in the carrier accumulation region, so that the accumulated carriers are susceptible to variation in potential on the potential barrier 6. The configuration of the present embodiment is particularly effective for the above case.

When an ordinary MOS transistor is used as the first transfer portion to operate the global electronic shutter, the carriers generated in each photoelectric conversion region 301 are transferred to the carrier accumulation region 302 by collectively turning on the first transfer portion. After that, the second transfer portion 305 sequentially transfers the carriers to the FD region. The start of accumulation time controls a potential on the semiconductor substrate to control the potential barrier from the photoelectric conversion region toward the semiconductor substrate, thereby switching a carrier discharge state and an accumulation state where the potential barrier is formed to enable carriers to be accumulated. The details are described in Japanese Patent Application Laid-Open No. 2005-166731.

An amplifying transistor 306 forms a part of an amplifying portion. The gate functioning as the input portion of the amplifying portion is connected to the FD region 304. For this reason, the gate of the amplifying transistor and the FD region function as the input portion of the amplifying portion. The amplifying transistor may be formed of a MOS transistor or a junction transistor, for example. Herein, a MOS transistor is taken as an example. The amplifying transistor forms a source follower with a constant current source (not shown) and reads a signal based on a voltage of the FD region 304 to a vertical signal line.

A reset portion 307 supplies a voltage for setting a potential on the FD region 304 to a reference voltage (reset voltage). The reset portion is formed of, for example, a MOS transistor and a voltage supplying portion (not shown) for supplying a reset voltage to the drain of the MOS transistor. A selecting portion 308 selectively outputs a signal of each pixel to the vertical signal line. The selecting portion is also formed of a MOS transistor, for example.

A wiring Tx is used to control each transfer portion. A wiring RES is used to control the reset portion. A wiring SEL is used to control the selecting portion. A signal line (vertical signal line) OUT is used to output signals from a plurality of pixels.

Figure 4:
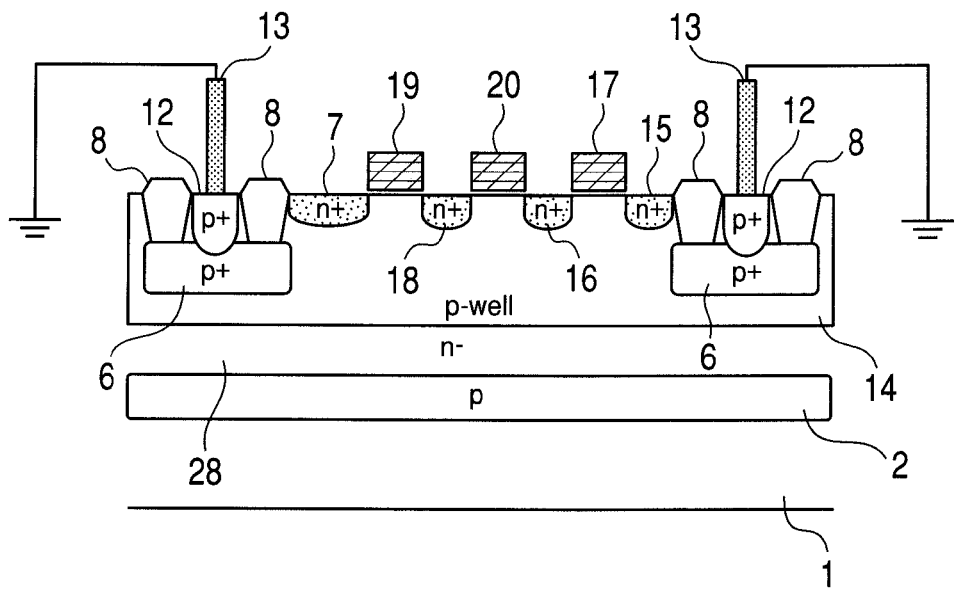
FIG. 4 is a schematic diagram for describing the first embodiment and a cross section taken along the line D-D' of FIG. 2.

FIG. 4 is a cross section taken along with the line D-D' of FIG. 2. The members having the same functions as the members in FIG. 1 are given the same reference numerals to omit the detailed description thereof. As described above, the P-type semiconductor region 12 is made adjacent to the potential barrier 6 to reduce the width of variation in potential on the potential barrier 6. More desirably, as illustrated in FIG. 4, the P-type semiconductor region 12 can be electrically connected to the potential barrier 6. The P-type semiconductor region 12 can be arranged in the active region in which the source region 15 being the output nodes of the FD region 7 and the amplifying MOS transistor is arranged and the active region adjacent through the element isolation region 8. This is because a potential on the FD region 7 and the source region 15 varies at the time of reading a signal to cause a potential on the potential barrier 6 through the P-type well 14. The P-type semiconductor region 12 is made adjacent to the potential barrier 6 to enable the width of variation in potential to be reduced. The P-type semiconductor region 12 can be arranged in the active region adjacent through the element isolation region of any of the active region in which the carrier accumulating region 5 is arranged, the active region in which the FD region 7 is arranged or the active region in which the amplifying MOS transistor is arranged. The P-type semiconductor region 12 can be arranged in the active region adjacent to the two active regions out of the above regions, or more desirably, the P-type semiconductor region 12 can be arranged in the active region adjacent to all the active regions.

Figure 5:
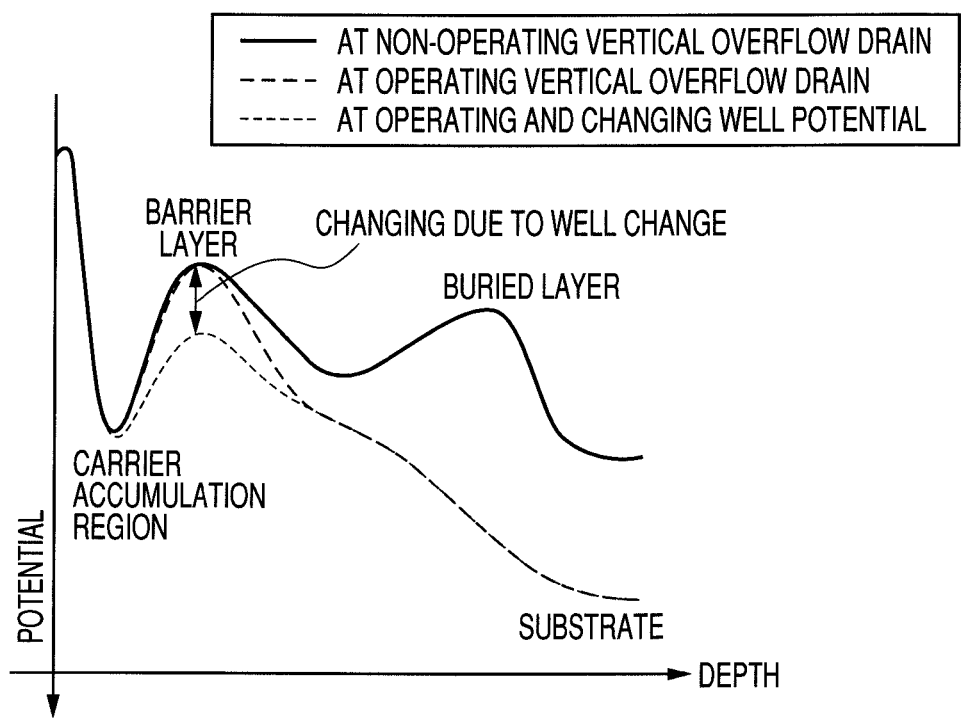
FIG. 5 is a potential diagram taken along the line Y-Y' of FIG. 1.

FIG. 5 is a potential diagram taken along the line Y-Y' of FIG. 1. In the figure, a carrier accumulation region denotes a depth position of the carrier accumulating region 5 in the substrate, a barrier layer denotes a depth position of the potential barrier 6 in the substrate and a buried layer denotes a depth position of the buried layer 2 in the substrate. Ideally speaking, as indicated by a dotted line of the VOFD operation, it is desirable that a potential on the carrier accumulating region 5 does not vary at the time of the operation of the VOFD. As indicated by a dotted line denoting "at operating & changing well potential," the variation of a potential on the source and the drain region of each MOS transistor varies during the operation of the VOFD function, and significantly influences a potential on the potential barrier 6. This is because variation in potential on the source and the drain region causes a potential on the P well 14 to vary, which is transferred to the potential barrier 6. Even in such a case, a reference voltage is supplied to the potential barrier 6 through the P-type semiconductor region 12 to enable variation in potential on the potential barrier 6 to be reduced.

As illustrated in the figure, the potential barrier 6 is desirably more extended toward the N-type semiconductor region 3 than the carrier accumulating region 5. This is because the potential barrier can be kept high even at the side edge of the photoelectric conversion region of the carrier accumulating region 5.

As described above, according to the present invention, it is enabled to reduce the flow of carriers accumulated in the carrier accumulating region 5 and caused by variation in potential on the electrode region of each MOS transistor during the operation of the VOFD function.

Second Embodiment

The second embodiment is described with reference to FIGS. 1, 2 and 6.

Figure 6:
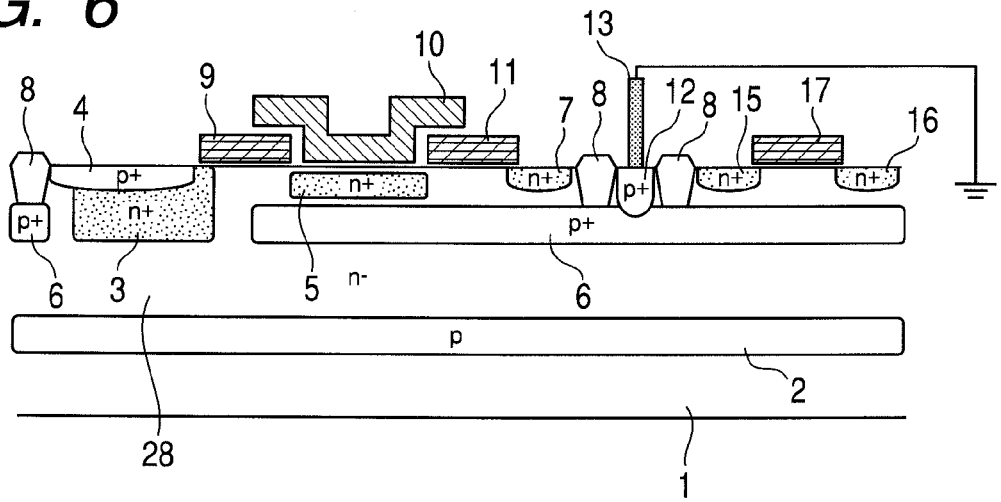
FIG. 6 is a schematic diagram for describing a second embodiment and a cross section taken along the line C-C' of FIG. 2.

FIG. 6 is a cross section taken along with the line C-C' of FIG. 2. The present embodiment is different from the first embodiment in that the potential barrier 6 is more extensive than the potential barrier 6 in the first embodiment, but the P well 14 is not arranged. Specifically, the potential barrier 6 is arranged under the FD region 7 and the source and the drain region 15 and 16 of the amplifying transistor. The potential barrier 6 may extend to under the source and the drain region of other MOS transistors. In such a configuration, if a potential on the source and the drain region of each MOS transistor varies during the operation of the VOFD function, a potential on the potential barrier 6 varies. However, the reference voltage is supplied to the potential barrier 6 through the P-type semiconductor region 12 to allow variation in potential to be reduced.

As is the case with the first embodiment and as illustrated in the figure, the potential barrier 6 is desirably more extended toward the N-type semiconductor region 3 than the carrier accumulating region 5.

The P-type well 14 may be partially arranged. Only the potential barrier 6 may be arranged in the region where the carrier accumulating region 5 is arranged, for example. Both the potential barrier 6 and the P well 14 may be arranged in the region where the MOS transistors are arranged.

Third Embodiment

The third embodiment is described with reference to FIGS. 1, 2 and 7.

Figure 7:
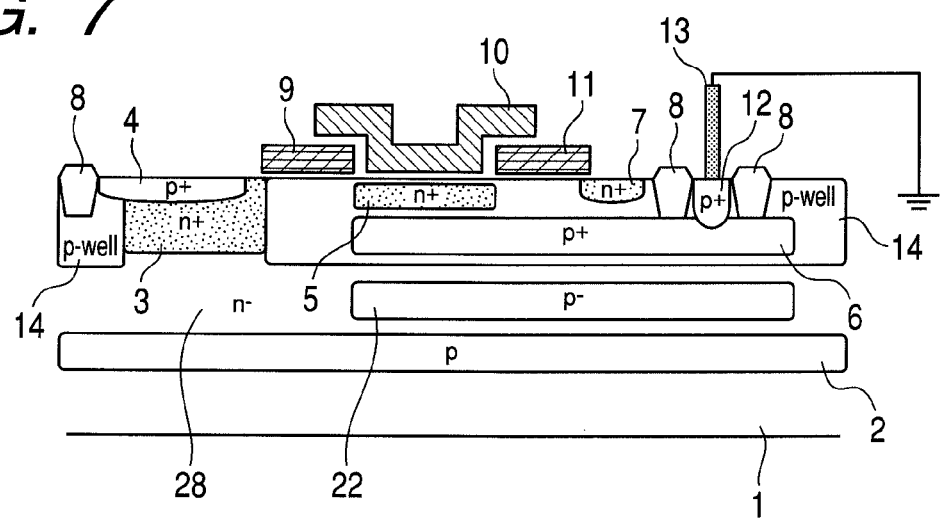
FIG. 7 is a cross section for describing a third embodiment.

FIG. 7 is a cross section taken along with the line C-C' of FIG. 2. The present embodiment is different from the first and the second embodiment in that a P-type semiconductor region 22 is further arranged under the P-type semiconductor region 6. FIG. 7 makes a description with reference to an example of configuration of the first embodiment. The P-type semiconductor region 22 is lower in impurity concentration than the potential barrier 6. A potential on the buried layer 2 is fixed at the outer periphery outside the pixel region.

In a case where the N-type semiconductor region 28 is arranged between the buried layer 2 and the potential barrier 6 like FIG. 1 to operate the VOFD, variation in potential on the buried layer 2 is prevented from being transferred to the potential barrier 6 due to capacitive coupling between the buried layer 2 and the potential barrier 6.

If any variation in potential occurs on the buried layer 2 when the VOFD function is not operated, a time constant in which variation in potential attenuates is different between the center portion and the outer periphery of the pixel region due to a difference in resistance from the center portion and the outer periphery thereof to the potential fixed point (voltage supply portion) of the buried layer 2. This may cause a phenomenon referred to as shading. The difference in time constant is especially greater in a present image sensor greater in the number of pixels and an imaging area (area of a pixel region).

Then, the P-type semiconductor region 22 is arranged under the potential barrier 6 as illustrated in FIG. 7 to adjust an impedance between the buried layer 2 and the potential barrier 6 by the concentration and depth of the P-type semiconductor region 22.

Adjusting the impedance between the buried layer 2 and the potential barrier 6 enables decreasing a difference in resistance between the center portion and the outer periphery of the pixel region of the buried layer 2 within the range in which a potential on the potential barrier 6 is not varied at the time of performing the VOFD function. In other words, improvements are compatible on the above problems occurring when the VOFD function is operated and not operated.

In FIG. 7, although a single P-type semiconductor region 22 is arranged, a plurality of the regions may be arranged depending upon a position or concentration relationship between the buried layer 2 and the potential barrier 6.

If the P-type semiconductor region 22 is higher in impurity concentration than the buried layer 2, there may be caused variation in potential on the potential barrier 6 at the time of performing the VOFD function, so that the P-type semiconductor region 22 is made lower in impurity concentration than the buried layer 2.

Fourth Embodiment

The fourth embodiment is described with reference to FIGS. 1 and 2, and FIGS. 8 to 11.

Figure 8:
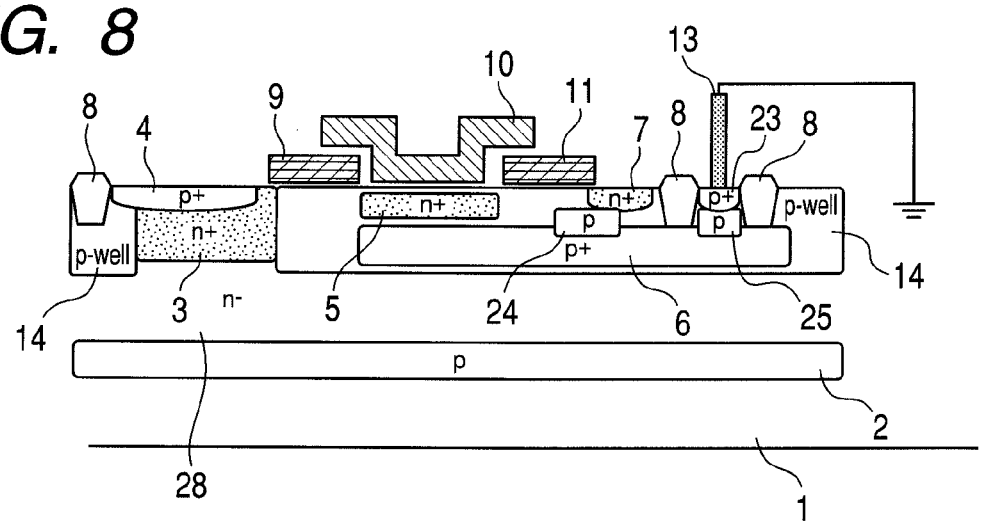
FIG. 8 is a cross section for describing a fourth embodiment.

FIG. 8 is a part of a cross section taken along with the line C-C' of FIG. 2. The present embodiment is different from the first to the third embodiment in that a P-type semiconductor region 24 is arranged between the potential barrier 6 and the FD region 7 and the P-type semiconductor region 12 is formed of P-type semiconductor regions 23 and 25. The P-type semiconductor region 24 functions as a channel dope of the second transfer portion.

In such a configuration, the degree of electric conduction (electric resistance) can more easily be controlled than the case where an impurity is injected once to cause the potential barrier 6 to electrically conduct to the electrode 13 like the P-type semiconductor region 12 in the first to third embodiment. Thereby, variation in potential on the potential barrier 6 can be more substantially reduced.

In addition, the forming process for the P-type semiconductor region 12 can be eliminated by forming the P-type semiconductor region 23 simultaneously with the P-type semiconductor region 4 and by forming the P-type semiconductor region 25 simultaneously with a channel dope 24 of the MOS transistor.

A method of producing the solid-state imaging apparatus according to the present embodiment is described below.

Figure 9A:
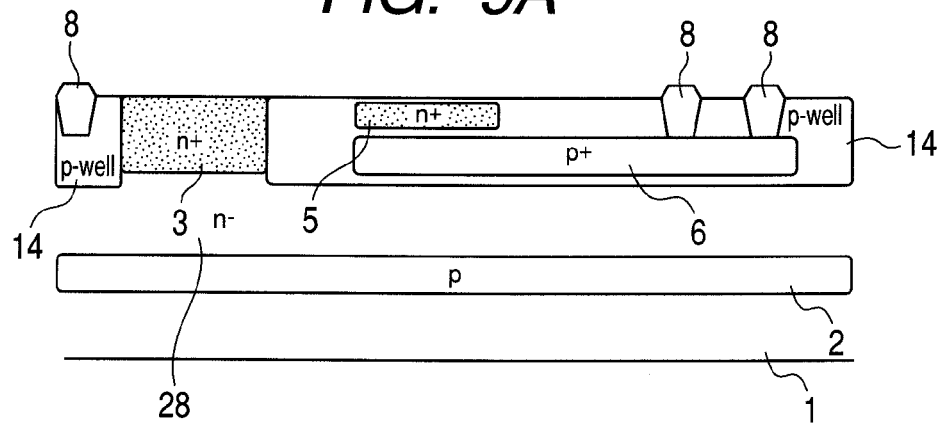
FIGS. 9A, 9B and 9C are schematic diagrams illustrating production processes for forming the solid-state imaging apparatus in the fourth embodiment.

First of all, the P-type semiconductor regions 2, 6, 8 and 14 and the N-type semiconductor regions 3 and 5 are formed over the semiconductor substrate 1 using a conventional method (refer to FIG. 9A).

Figure 9B:
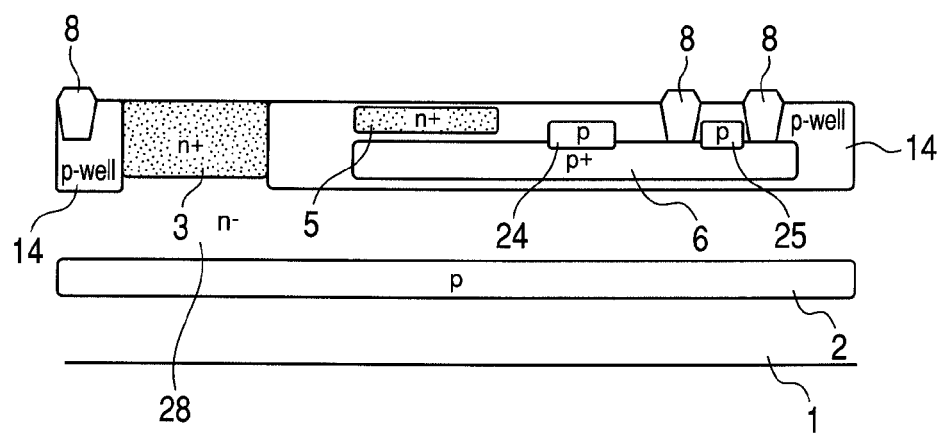

The P-type semiconductor region 24 as a channel dope is formed, under the region where the second transfer gate 11 is formed, simultaneously with the P-type semiconductor region 25 for reducing variation in potential on the potential barrier 6, using a mask pattern (refer to FIG. 9B).

Figure 9C:
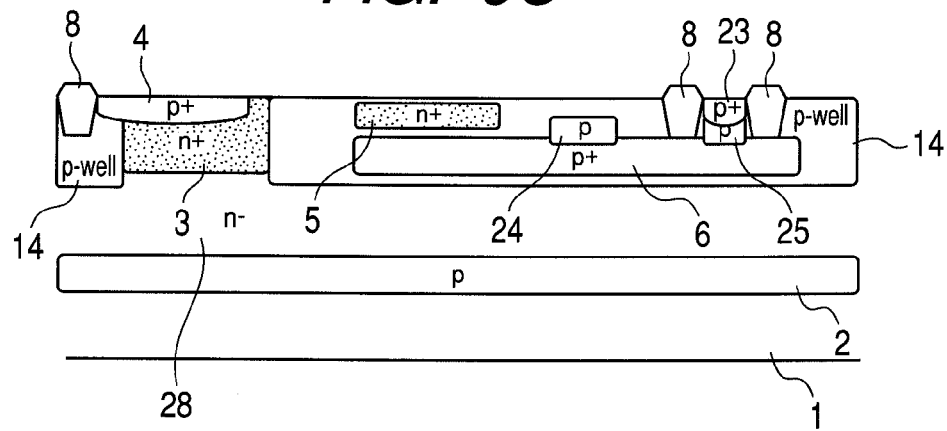

The P-type semiconductor regions 4 and 23 are simultaneously formed using a different mask pattern (refer to FIG. 9C).

After that, the gate electrodes 9, 10 and 11, the FD region 7 and the electrode 13 are formed by a conventional method. The solid-state imaging apparatus illustrated in FIG. 8 can be produced by the above producing method. Incidentally, the order of the production process is not limited to the order in the above example. The P-type semiconductor regions 4 and 23 may be formed after the gate electrode was formed, for example. Alternatively, the FD region 7 is formed and then the P-type semiconductor regions 4 and 23 may be formed. Each semiconductor region may be formed in the semiconductor substrate by ion injection, each semiconductor region may be formed on the semiconductor substrate by an epitaxial method or each semiconductor region may be formed in an epitaxial layer by ion injection.

Fifth Embodiment

Figure 10:
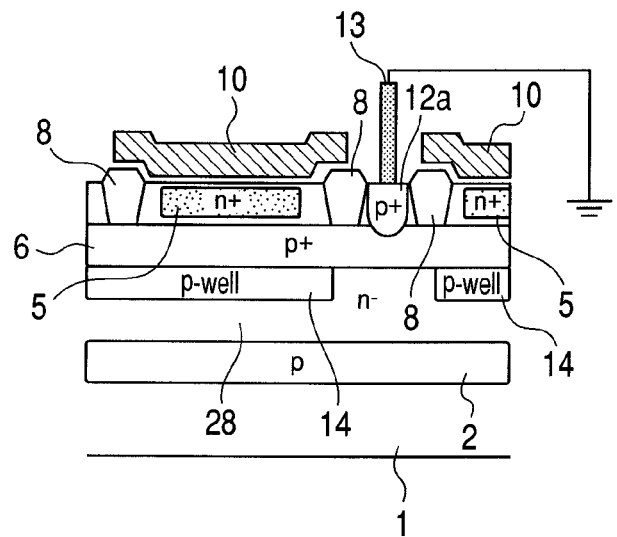
FIG. 10 is a schematic diagram for describing a fifth embodiment and a cross section taken along the line G-G' of FIG. 13.
Figure 11:
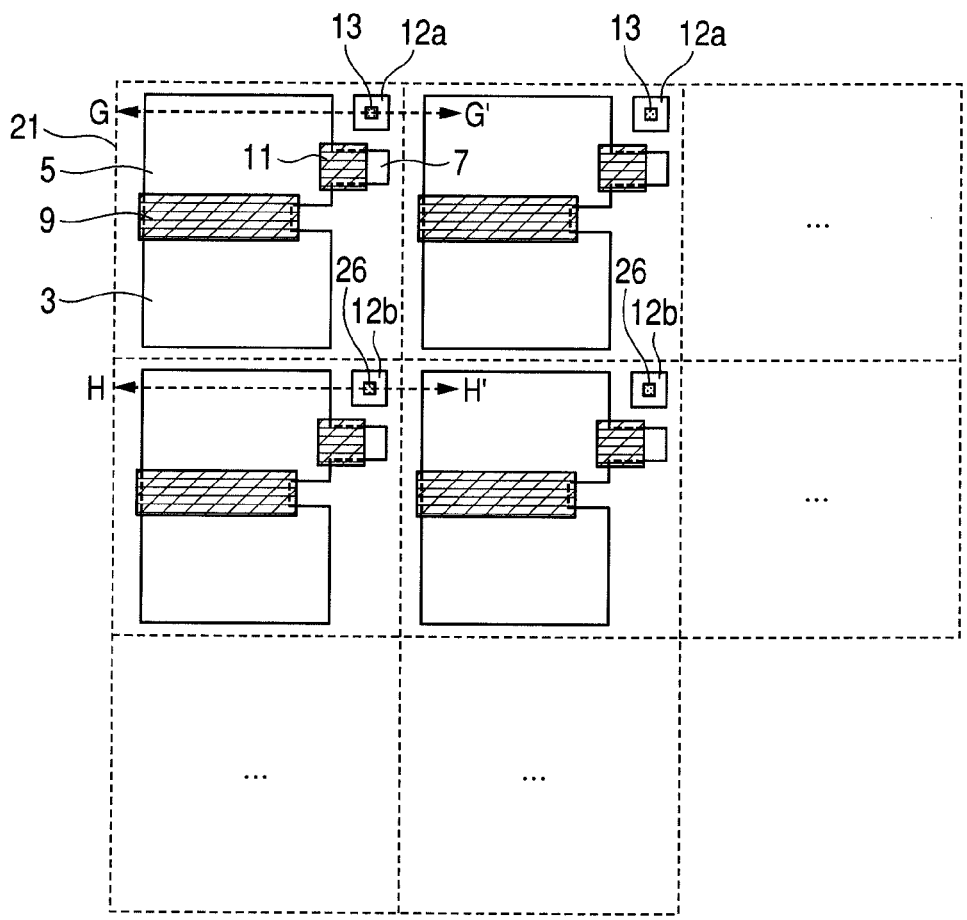
FIG. 11 is a plan view for describing the fifth embodiment.
Figure 12:
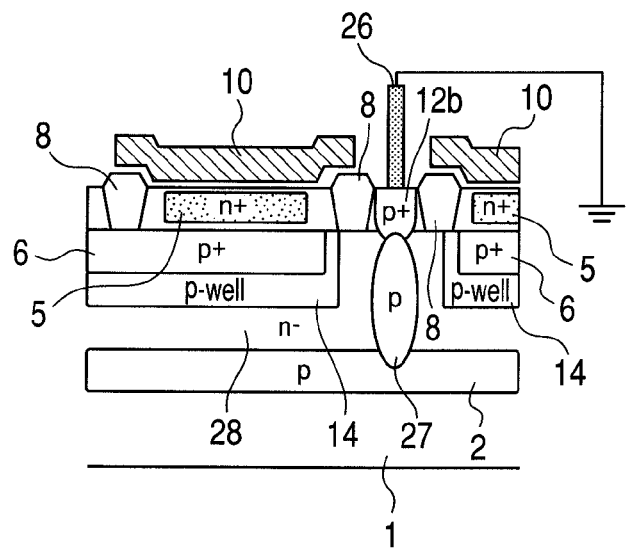
FIG. 12 is a schematic diagram for describing the fifth embodiment and a cross section taken along the line H-H' of FIG. 13.

The fifth embodiment is described with reference to FIGS. 10 to 12. FIG. 11 is a plan view in which the MOS transistor is omitted to describe the present embodiment. FIG. 10 is a schematic cross section taken along the line G-G' of FIG. 11. FIG. 12 is a schematic cross section taken along the line H-H' of FIG. 11.

The present embodiment is different from the first to the fourth embodiment in that the P well 14 is separated under the P-type semiconductor region 12. In addition, the voltage supply portion formed of the P-type semiconductor region 12 for reducing variation in potential and an electrode is formed of a plurality of voltage supply portions for supplying a voltage to different P-type semiconductor regions. Specifically, there are provided a first voltage supply portion for supplying a reference voltage to the potential barrier 6 and a second voltage supply portion for supplying a reference voltage to the buried layer 2.

In FIG. 10, a P-type semiconductor region 12a (a fifth semiconductor region) is electrically connected to the potential barrier 6 and a first electrode 13. In other words, the P-type semiconductor region 12a functions as the first voltage supply portion for supplying a reference voltage to the potential barrier 6.

In FIG. 12, a P-type semiconductor region 12b (a sixth semiconductor region) is connected to the buried layer 2 through a P-type semiconductor region 27. A second electrode 26 is connected to the P-type semiconductor region 12b. In other words, the P-type semiconductor region 12b functions as the second voltage supply portion for supplying a reference voltage to the buried layer 2. It is presumed here that the P-type semiconductor region 27 is not electrically connected to the potential barrier 6.

As illustrated in FIG. 11, the positions in the pixel regions of the regions where the first and the second electrode 13 and 26 are periodically arranged on a row basis. The electrodes 13 and 26 are connected to power supplies different from each other and capable of separately controlling the power supplies.

According to the present embodiment, both potentials on the potential barrier 6 and the buried layer 2 can be independently controlled in the pixel region. If any variation in potential occurs on the buried layer 2 when the VOFD function is not operated, a time constant in which variation attenuates is different between the center portion and the outer periphery of the pixel region due to a difference in resistance from the center portion and the outer periphery thereof to the potential fixed point of the buried layer 2. This may cause a shading effect. The difference in time constant is especially greater in a present image sensor which becomes greater in the number of pixels. According to the present embodiment, the difference in a time constant can be reduced. Although the figure describes a configuration in which the P well is provided, the present embodiment is also applicable to a configuration in which the potential barrier 6 is provided instead of the P well like the second embodiment.

Sixth Embodiment

Figure 13:
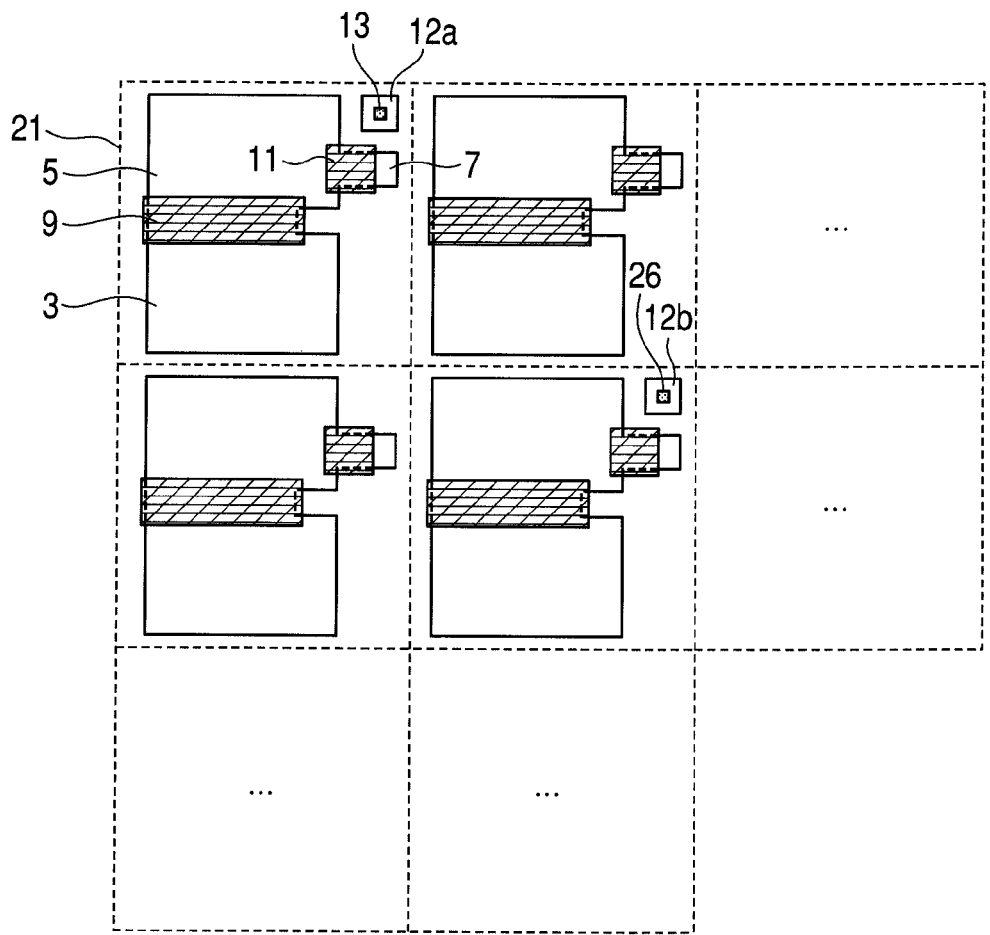
FIG. 13 is a plan view for describing a sixth embodiment.

The present embodiment is described with reference to FIG. 13. In FIG. 13, the present embodiment is different from the fifth embodiment in that the P-type semiconductor regions 12 are thinned out. That is to say, the P-type semiconductor regions 12 are arranged not on all pixels but on the basis of a plurality of pixels.

Such a configuration enables a layout area to be reduced.

Seventh Embodiment

Figure 14:
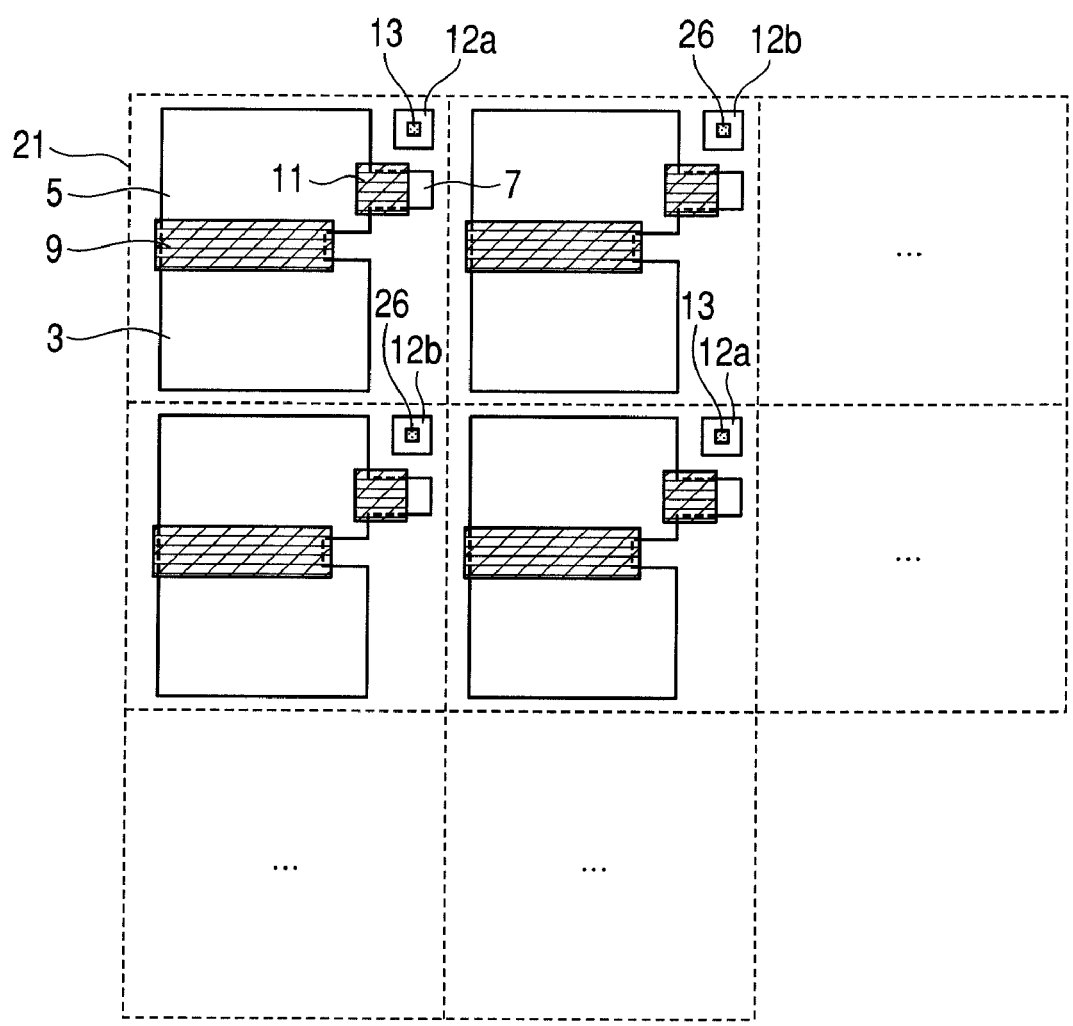
FIG. 14 is a plan view for describing a seventh embodiment.

The present embodiment is described with reference to FIG. 14. In FIG. 14, the present embodiment is different from the fifth embodiment in that the region where the first electrode 13 is arranged and the region where the second electrode 26 is arranged are arranged not on a row basis, but in a checkered pattern.

According to such a configuration, fixed state of potential on the buried layer 2 and the potential barrier 6 is not weakened as compared to the fixed state in the fifth embodiment. Furthermore, it is enabled to prevent problems with a sensitivity ratio between the same color pixels from being caused because two green pixels are equal to each other in shape when a color filter is arranged in a Bayer color array in the pixel region.

As described above, according to the solid-state imaging apparatus of the present invention, even when the VOFD function is used to realize the electronic shutter function, variation in the amount of accumulated carriers in the carrier accumulation region is reduced to permit a high image-quality photographing.

In the above embodiments, although a description is made with an electron as a carrier, it is not limited to an electron. The above effect and operation can be achieved even with a hole as a carrier. In that case, a potential may be properly reversed.

In the above embodiments, although there is described an example where the control gate of the carrier accumulation region is formed of a double layered poly-silicon, the gist of the present invention is to provide the carrier accumulation region, so that the control gate of the carrier accumulation region may be formed of a plural (two or more) layered poly-silicon or single layered poly-silicon, for example.

The present invention is not limited to the above embodiments, and further modifications and combinations can be made without departing from the spirit of the present invention.

According to the present invention, even when the VOFD function is used, variation in the amount of accumulated carriers is reduced to permit a high image-quality photographing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-101560, filed Apr. 9, 2008, which is hereby incorporated by reference herein in its entirety.

What is claimed is:

1. A solid-state imaging apparatus, adapted to perform a vertical overflow drain operation, comprising:
   a semiconductor substrate of a first conductivity type; and
   a plurality of pixels arranged in a pixel region of the semiconductor substrate, each pixel including a photoelectric conversion region and an amplifying transistor for amplifying a signal based on signal carriers generated in the photoelectric conversion region and for outputting an amplified signal,
   wherein the pixel region includes:
   a first semiconductor region of the first conductivity type for forming a part of the photoelectric conversion region,
   a second semiconductor region of the first conductivity type, provided separately from the first semiconductor region, for accumulating the carriers generated in the first semiconductor region,
   a third semiconductor region of a second conductivity type arranged under the second semiconductor region, as a potential barrier holding the accumulated carriers in the second semiconductor region,
   a fourth semiconductor region of the second conductivity type extending between the first semiconductor region and the semiconductor substrate, and between the third semiconductor region and the semiconductor substrate, and
   a first voltage supply portion for supplying, to the third semiconductor region, a reference voltage for suppressing a variation in potential in the third semiconductor region due to the vertical overflow drain operation.

2. The solid-state imaging apparatus according to claim 1, wherein the first voltage supply portion is one of a plurality of first voltage supply portions arranged in the pixel region.

3. The solid-state imaging apparatus according to claim 1, wherein the amplifying transistor includes source and drain regions arranged in a well of the second conductivity type, and
   the well is electrically connected to the third semiconductor region.

4. The solid-state imaging apparatus according to claim 1, further comprising a floating diffusion region of the first conductivity type connected to a gate of the amplifying transistor, wherein the third semiconductor region extends under source and drain regions of the amplifying transistor.

5. The solid-state imaging apparatus according to claim 1, wherein the third semiconductor region has an impurity concentration higher than an impurity concentration of the fourth semiconductor region.

6. The solid-state imaging apparatus according to claim 1, wherein an impurity concentration of a region between the third and fourth semiconductor regions is lower than an impurity concentration of the fourth semiconductor region.

7. The solid-state imaging apparatus according to claim 1, further comprising a second voltage supply portion, provided separately from the first voltage supply portion, for supplying a reference voltage to the fourth semiconductor region arranged in the pixel region, wherein
   the second voltage supply portion includes a fifth semiconductor region of the second conductivity type, and a second electrode connected to the fifth semiconductor region, and
   a power source for supplying the voltage to a first electrode of the first voltage supply portion is separately provided from a power source for supplying the voltage to the second electrode.

* * * * *